United States Patent
Ohta (10) Patent No.: US 8,585,188 B2
(45) Date of Patent: Nov. 19, 2013

(54) THIN-FILM ACTUATOR, LIQUID EJECTION HEAD, INK CARTRIDGE, AND IMAGE FORMING APPARATUS

(71) Applicant: Eiichi Ohta, Atsugi (JP)

(72) Inventor: Eiichi Ohta, Atsugi (JP)

(73) Assignee: Ricoh Company, Limited, Tokyo (JP)

(*) Notice: Subject to any disclaimer, the term of this patent is extended or adjusted under 35 U.S.C. 154(b) by 0 days.

(21) Appl. No.: 13/659,585

(22) Filed: Oct. 24, 2012

(65) Prior Publication Data

US 2013/0050353 A1 Feb. 28, 2013

Related U.S. Application Data

(62) Division of application No. 12/723,064, filed on Mar. 12, 2010, now abandoned.

(30) Foreign Application Priority Data

Mar. 13, 2009 (JP) .................................. 2009-061283

(51) Int. Cl.
*B41J 2/045* (2006.01)

(52) U.S. Cl.
USPC ................. 347/71; 347/68; 347/70; 347/72; 310/323.06

(58) Field of Classification Search
USPC ......... 347/68–72; 310/323.06, 331–333, 342, 310/366
See application file for complete search history.

(56) References Cited

U.S. PATENT DOCUMENTS

| 2004/0046481 A1* | 3/2004 | Takeuchi et al. ............... 310/311 |
| 2007/0247026 A1 | 10/2007 | Tsukamura et al. |
| 2008/0218560 A1* | 9/2008 | Noguchi et al. ................. 347/71 |
| 2009/0026887 A1* | 1/2009 | Fujii et al. ...................... 310/330 |

FOREIGN PATENT DOCUMENTS

| JP | 11-263009 A | 9/1999 |
| JP | 2000-313119 A | 11/2000 |
| JP | 2003-347619 A | 12/2003 |
| JP | 2008-44217 | 2/2008 |
| JP | 2008-47689 | 2/2008 |
| JP | 4138420 | 6/2008 |
| JP | 2008-155461 A | 7/2008 |
| JP | 2011-000738 | * 1/2011 ............... B41J 2/045 |
| WO | WO 02/073710 A1 | 9/2002 |

OTHER PUBLICATIONS

Office Action issued Feb. 5, 2013 in Japanese Patent Application No. 2009-061283.

* cited by examiner

*Primary Examiner* — Henok Legesse (74) *Attorney, Agent, or Firm* — Oblon, Spivak, McClelland, Maier & Neustadt, L.L.P.

(57) ABSTRACT

A thin-film actuator that deforms a diaphragm to generate force includes a lower electrode disposed on the diaphragm, a first piezoelectric layer disposed on the lower electrode, an intermediate electrode disposed on the first piezoelectric layer, a second piezoelectric layer disposed on the intermediate electrode, and an upper electrode disposed on the second piezoelectric layer.

10 Claims, 5 Drawing Sheets

THIN-FILM ACTUATOR, LIQUID EJECTION HEAD, INK CARTRIDGE, AND IMAGE FORMING APPARATUS

CROSS-REFERENCE TO RELATED APPLICATIONS

This application is a divisional application of application Ser. No. 12/723,064, filed Mar. 12, 2010 and is based upon and claims the benefit of priority, pursuant to 35 U.S.C. §119, from Japanese Patent Application No. 2009-061283, filed on Mar. 13, 2009 in the Japan Patent Office, each of which is incorporated herein by reference in its entirety.

BACKGROUND OF THE INVENTION

1. Field of the Invention

Illustrative embodiments of the present disclosure relate to a thin-film actuator, a liquid ejection device that ejects droplets of liquid, e.g., ink using the thin-film actuator, and an image forming apparatus that forms an image using the liquid ejection device.

2. Description of the Background

Image forming apparatuses are used as printers, facsimile machines, copiers, plotters, or multi-functional peripherals having two or more of the foregoing capabilities. As one type of image forming apparatus using a liquid ejection device, inkjet recording apparatuses are widely used because of advantages such as nearly noiseless operation, high-speed printing, greater flexibility of ink selection, and availability of recording sheets (e.g., plain sheets) at reasonable prices.

A liquid ejection device used in such an inkjet recording apparatus has nozzles through which ink droplets are ejected, liquid chambers (also referred to as ejection chambers, pressurized chambers, pressure chambers, or ink channels) that communicate with nozzles, and pressure generators for ejecting ink stored in the liquid chambers.

One type of pressure generator is a bubble-type (thermal-type) pressure generator that ejects ink droplets by generating bubbles by film-boiling of ink using an electro-thermo transducer, e.g., a heat-resistant body disposed in the liquid chamber. Another type is a piezo-type pressure generator that ejects ink droplets by deforming/displacing a diaphragm forming a wall of the liquid chamber using an electro-mechanical transducer such as a piezoelectric element. The piezo-type pressure generator comes in several types, including, e.g., a vertical-vibration type deforming in the d33 direction, a lateral-vibration type (bend mode type) deforming in the d31 direction, and a shear-mode type using shear deformation.

With recent advances in the fields of semiconductor processing and micro-electro-mechanical systems (MEMS), thin-film actuators have been proposed in which liquid chambers and piezoelectric elements are directly built into a silicon (Si) substrate. For example, one approach like that described in Japanese Patent Application No. 2008-047689 proposes a piezo-electric actuator including a diaphragm and a piezo-electric element for deforming the diaphragm. To provide an inkjet recording head of high density and high precision at a reduced cost, the approach proposes to reduce a residual stress in the diaphragm by doping the diaphragm with impurities. A lead zirconate titanate (PZT) film, serving as a piezoelectric element, is a thin film of a thickness of 5 μm formed by sputtering, and the diaphragm is made of oxidized Si film. In this approach, introducing germanium (Ge), lead (P), boron (B), and/or other substances as impurities into the oxidized Si film is proposed, and an appropriate doping amount is assumed to be 35 mol % or lower.

Although the above-described approach may be effective in reducing stress on the diaphragm, it fails to provide a way to increase the generation force to achieve higher densities.

Further, consistent displacement of the piezoelectric element is crucial to good printing performance. To reduce fluctuation or variation in the displacement of the piezoelectric element in the thin-film type of piezoelectric actuator, another approach proposes to form an inter-layer insulation layer with an opening that defines the deformable area of the piezoelectric element and to manufacture a piezoelectric element deformable only within the opening. In this approach, a PZT film serving as the piezoelectric element is a thin film of a thickness of 4 μm formed by sputtering, and the diaphragm is an Si film of a thickness of 4 μm.

Such a configuration may reduce unwanted electrostatic volume and limit the deformable area of the piezoelectric element, thereby reducing a fluctuation or variation in displacement of the piezoelectric element to some extent. However, this approach also fails to provide a way to increase the generation force to achieve higher densities.

In still another approach, in a thin-film piezoelectric actuator the piezoelectric element is set to a thickness of 5 μm or less and the width in the short direction of the diaphragm is set to 160 μm or less. Although such a configuration may create the generation force needed to achieve current levels of density, this approach also fails to provide a way to increase the generation force to achieve higher densities.

More specifically, the conventional thin-film piezoelectric actuator has a single-layer piezoelectric structure including only one piezoelectric layer, i.e., a structure formed with a lower electrode, a piezoelectric layer, and an upper electrode. In such a configuration, to increase the generation force of the actuator, both the thickness of the piezoelectric element and the width in the short direction of the diaphragm should be optimized according to the thickness of the diaphragm. Accordingly, increasing the actuator density may cause a significant reduction in the width in the short direction of the diaphragm. For example, in the case of 600 dpi, the width in the short direction of the diaphragm is approximately 30 μm, and in the case of 1,200 dpi, the width is approximately 15 μm. In such cases, to obtain a desired generation force, the thickness of the diaphragm should be extremely thick (e.g., approximately 7 μm or more) at a markedly thin region of the piezoelectric layer. If a piezoelectric actuator having a single piezoelectric layer as described above is manufactured in such a region, the small thickness of the diaphragm results in a low yield. Further, the great thickness of the piezoelectric layer causes an increase in driving voltage (e.g., reaching approximately 70V at the thickness of 7 μm of the diaphragm, depending on film properties), which is far from practical use.

SUMMARY OF THE INVENTION

In one illustrative embodiment, a thin-film actuator that deforms a diaphragm to generate force includes a lower electrode disposed on the diaphragm, a first piezoelectric layer disposed on the lower electrode, an intermediate electrode disposed on the first piezoelectric layer, a second piezoelectric layer disposed on the intermediate electrode, and an upper electrode disposed on the second piezoelectric layer.

In another illustrative embodiment, a liquid-droplet ejection head includes a nozzle orifice through which a liquid droplet is ejected, a pressure chamber connected to the nozzle orifice, a diaphragm that forms a wall of the pressure chamber, and a thin-film actuator that deforms the diaphragm to eject the liquid droplet from the nozzle orifice. The thin-film actuator includes a lower electrode disposed on the diaphragm, a first piezoelectric layer disposed on the lower electrode, an intermediate electrode disposed on the first piezoelectric layer, a second piezoelectric layer disposed on the intermediate electrode, and an upper electrode disposed on the second piezoelectric layer.

In still another illustrative embodiment, an image forming apparatus includes an ink cartridge. The ink cartridge includes an ink container that stores ink and a liquid-droplet ejection head integrated with the ink container. The liquid-droplet ejection head includes a nozzle orifice through which a liquid droplet is ejected, a pressure chamber connected to the nozzle orifice, a diaphragm that forms a wall of the pressure chamber, and a thin-film actuator that deforms the diaphragm to eject the liquid droplet from the nozzle orifice. The thin-film actuator includes a lower electrode disposed on the diaphragm, a first piezoelectric layer disposed on the lower electrode, an intermediate electrode disposed on the first piezoelectric layer, a second piezoelectric layer disposed on the intermediate electrode, and an upper electrode disposed on the second piezoelectric layer.

BRIEF DESCRIPTION OF THE DRAWINGS

A more complete appreciation of the disclosure and many of the attendant advantages thereof will be readily acquired as the same becomes better understood by reference to the following detailed description when considered in connection with the accompanying drawings, wherein.

The accompanying drawings are intended to depict illustrative embodiments of the present disclosure and should not be interpreted to limit the scope thereof. The accompanying drawings are not to be considered as drawn to scale unless explicitly noted.

DETAILED DESCRIPTION OF ILLUSTRATIVE EMBODIMENTS

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the illustrative embodiments are described with technical limitations with reference to the attached drawings, such description is not intended to limit the scope of the present invention and all of the components or elements described in the illustrative embodiments of this disclosure are not necessarily indispensable to the present invention.

Below, illustrative embodiments according to the present disclosure are described with reference to attached drawings.

First Illustrative Embodiment

Figure 1:
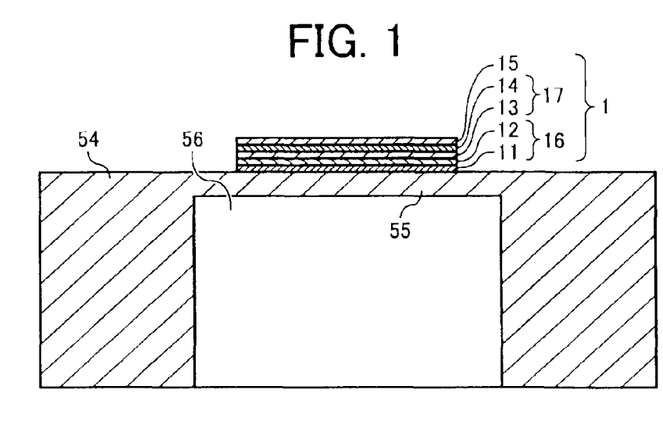
FIG. 1 is a cross-sectional view illustrating a thin-film actuator according to a first illustrative embodiment cut along a short direction thereof.

Below, a first illustrative embodiment is described with reference to FIG. 1. FIG. 1 is a cross-sectional view illustrating a thin-film actuator 1 according to the first illustrative embodiment cut along a short direction thereof. The cross section corresponds to a cross section cut along a line X-X' illustrated in FIGS. 4A and 5.

The thin-film actuator 1 has a structure in which a lower electrode 11, a first piezoelectric layer 12, an intermediate electrode 13, a second piezoelectric layer 14, and an upper electrode 15 are stacked on a diaphragm 55 in this order.

Next, a method of making the thin-film actuator 1 is described below.

First, a multi-layer film of Ti/Pt serving as the lower electrode 11 is formed on a surface of a silicon substrate 54 at a substrate temperature of, e.g., 200° C. by a sputtering method so as to have a thickness of approximately 100 nm.

Next, the first piezoelectric layer 12, the intermediate electrode 13, the second piezoelectric layer 14, and the upper electrode 15, which have been patterned to form the thin-film actuator 1, are stacked one on another on the lower electrode 11 to form a multi-layer structure. As for deposit conditions of the respective films, for example, a film of PZT (lead zirconate titanate) serving as the first piezoelectric layer 12 is deposited at a thickness of approximately 2 μm under a substrate temperature of, e.g., 550° C. by a sputtering method. A film of Pt serving as the intermediate electrode 13 is formed at a thickness of approximately 80 nm on the first piezoelectric layer 12, and a film of PZT serving as the second piezoelectric layer 14 is formed at a thickness of approximately 3.5 μm on the intermediate electrode 13 under conditions similar to those for the first piezoelectric layer 12. Further, a film of Pt serving as the upper electrode 15 is deposited at a thickness of 100 nm on the second piezoelectric layer 14. Patterning of each layer is performed by a photolithographic etching process such as a reactive ion etching (RIE) method or an inductively coupled plasma (ICP) method.

Finally, the silicon substrate 54 is partially removed from the back side of the silicon substrate 54, which is a side on which the thin-film actuator 1 is not formed, to the position of the diaphragm 55 illustrated in FIG. 1 so that a portion of the silicon substrate 54 corresponding to the diaphragm 55 is left at a certain thickness. Thus, a pressure chamber 56 and the diaphragm 55 are formed. The silicon substrate 54 including the pressure chamber 56 and the diaphragm 55 produced in the above-described manner constitutes a chamber substrate 52 in an inkjet head 50 illustrated in FIG. 5.

In this disclosure, the term "deformation layer" represents an activation area, that is, an area deformed in each piezoelectric layer by an electric field between the upper electrode 15 and the lower electrode 11. The lower electrode 11 and the first piezoelectric layer 12 are collectively referred to as a first deformation layer 16, and the intermediate electrode 13 and the second piezoelectric layer 14 are collectively referred to as a second deformation layer 17.

Advantageous effects of the thin-film actuator described above are described below.

The thin-film actuator 1 according to the present illustrative embodiment has at least two deformation layers including the first deformation layer 16 and the second deformation layer 17. Such a plurality of deformation layers allows the thin-film actuator 1 to create a greater generation force while preventing an increase in driving voltage than an actuator of a single deformation layer. Thus, the configuration according to the present illustrative embodiment can provide at a reasonable cost a downsized, high-density thin-film actuator capable of creating a great generation force at relatively low driving voltage. Such a configuration also allows downsizing of the piezoelectric element.

The method of making the thin-film actuator 1 is further described below in more detail.

As the material of the lower electrode 11 and the upper electrode 15, for example, a heat-resistant material of high affinity to the PZT material of piezoelectric element may be employed. Such a material may be, for example, Ir, Au, Ru, Pt, Ta, $PtO_2$, $TaO_4$, $IrO_2$, or the like. In this regard, it is to be noted that the electrode material of the lower electrode 11 and the upper electrode 15 is not limited to the above-described examples and may be any other suitable material.

The stacking (film formation) of PZT layers may be performed by a sol-gel method, an aerosol deposition (AD) method, an ion plating method, or any other suitable method. For example, the sol-gel method is advantageous in that a film formation device may be obtained at a reasonable cost and d31 films of high withstand voltage are formed at relatively low film-formation temperature.

Below, an example of forming thin films of piezoelectric element by the sol-gel method is described.

First, a sol is prepared by hydrolyzing an alkoxide (such as a methoxide, ethoxide, propoxide, or butoxide) or acetate compound of a metal such as titanium, zirconium, lead, or zinc with, e.g., an acid. The prepared sol is applied on the lower electrode 11 by, e.g., spin coating or dip coating. After the coating, the lower electrode 11 is dried at a prescribed temperature for a certain time period to evaporate the solvent of the sol. The drying temperature is, e.g., not lower than 150° C. and not higher than 200° C., and the drying time is, e.g., not less than 5 minutes and not more than 15 minutes.

Then, in the atmosphere, the lower electrode 11 is preliminarily burned at a predetermined temperature for a certain time period. For example, the entire substrate may be heated by closely fitting to a hot plate so that the heat of the hot plate is conducted to the entire substrate. The temperature of the preliminary burning is, e.g., not less than 300° C. and not more than 500° C., and the time period of the preliminary burning is, e.g., not less than 5 minutes and not more than 30 minutes. By the preliminary burning, an organic material coordinated with the metal is dissociated from the metal, causes an oxidation burning reaction, and is scattered in the atmosphere. Further, the entire substrate is burned for crystallization so that a piezoelectric layer is formed. The burning is performed by using, e.g., a rapid thermal annealing (RTA) system or a diffusion furnace. The burning temperature is, e.g., not less than 550° C. and not more than 750° C., and the burning time is, e.g., not more than 60 minutes.

Second Illustrative Embodiment

Next, a second illustrative embodiment is described below.

Figure 2:
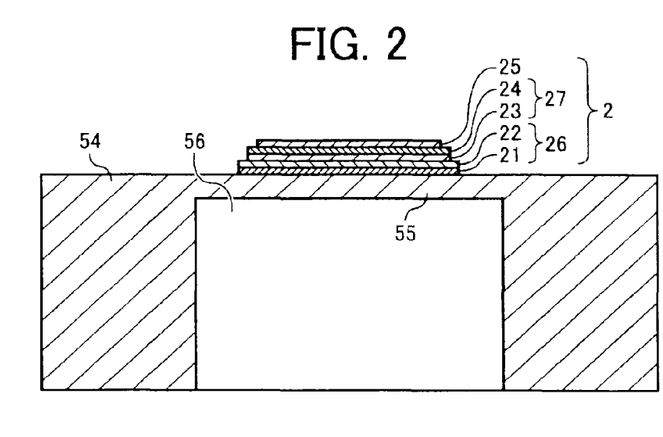
FIG. 2 is a cross-sectional view illustrating a thin-film actuator according to a second illustrative embodiment cut along a short direction thereof.

FIG. 2 is a cross-sectional view illustrating a thin-film actuator 2 according to the second illustrative embodiment cut along a short direction thereof. One end portion of each electrode in the short direction is provided with a wire. The same reference numbers are allocated to the same components as those of the first illustrative embodiment and descriptions thereof are omitted for simplicity.

In the electrostatic actuator 2, an intermediate electrode 23 has shorter edges at non-wired sides thereof than those of a first piezoelectric layer 22, and an upper electrode 25 has shorter edges at non-wired sides thereof than those of a second piezoelectric layer 24. A lower electrode 21 has non-wired edges of substantially the same length as those of the first piezoelectric layer 22. The intermediate electrode 23 has non-wired edges of substantially the same length as the second piezoelectric layer 24. In other words, non-wired peripheral edges of an electrode layer formed on a piezoelectric layer are disposed close to the center of the actuator at a distance away from non-wired peripheral edges of a thin film constituting the piezoelectric layer. Accordingly, the edges of an electrode layer are spaced from the edges of an electrode layer disposed lower than the electrode layer. Specifically, the non-wired peripheral edges of the intermediate electrode 23 formed on the first piezoelectric layer 22 are spaced at a distance from the non-wired peripheral edges of the first piezoelectric layer 22 to create a step between the edges of the first piezoelectric layer 22 and the edges of the intermediate electrode 23. Such a configuration allows lengthening a distance between the edges of the lower electrode 21 and the edges of the intermediate electrode 23. Further, applying such a configuration to the second piezoelectric layer 24 and the upper electrode 25 allows lengthening a distance between the edges of the intermediate electrode 23 and the edges of the upper electrode 25.

In the thin-film actuator 1 according to the first illustrative embodiment, end faces of the respective thin films are linearly aligned. If pulses of high voltage are applied for driving, surface leakage might occur depending on the environment in which the thin-film actuator 1 is used. As a result, an electric current might flow between the lower electrode 11 and the intermediate electrode 13 and/or between the intermediate electrode 13 and the upper electrode 15 via the end faces of the thin films. Consequently, electric voltage might not be properly applied to the deformation layers. Further, if still higher voltage is applied, dielectric breakdown might occur in the air gap between electrodes, thus causing damage against the piezoelectric elements.

Hence, in the present illustrative embodiment, non-wired peripheral edges of an electrode layer formed on each piezoelectric layer are disposed closer to the center of the actuator than non-wired peripheral edges of a thin film constituting each piezoelectric layer. Such a configuration allows lengthening the length of a gap between the respective electrodes, thus preventing surface leakage and dielectric breakdown of air gap. Incidentally, the process of making the electrostatic actuator 2 according to the present illustrative embodiment is similar to the process of making the thin-film actuator 1, and therefore descriptions thereof are omitted for simplicity.

Third Illustrative Embodiment

The third illustrative embodiment is described below.

Figure 3:
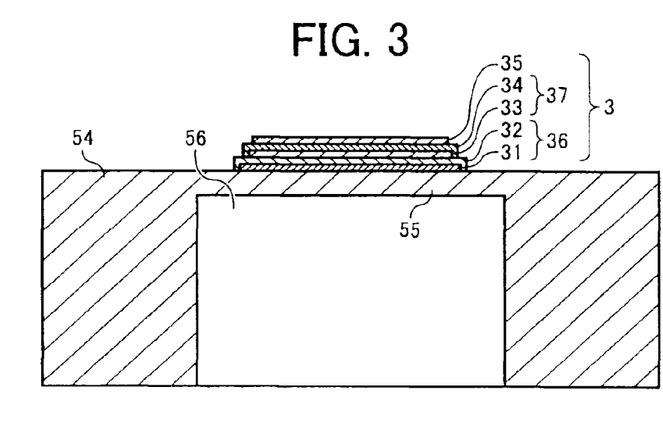
FIG. 3 is a cross-sectional view illustrating a thin-film actuator according to a third illustrative embodiment cut along a short direction thereof.

FIG. 3 is a cross-sectional view illustrating a thin-film actuator 3 according to the third illustrative embodiment cut along a short direction thereof. The same reference numbers are allocated to the same components as those of the above-described illustrative embodiments and descriptions thereof are omitted for simplicity.

The thin-film electrostatic actuator 3 has a configuration capable of reducing electrical failures during driving as compared to the configuration of the second illustrative embodiment. Specifically, a lower electrode 31 is covered with a first piezoelectric layer 32, and an intermediate electrode 33 is covered with a second piezoelectric layer 34. For such a configuration, the piezoelectric layers covering the electrodes protect the electrodes as a protective coating, thus preventing surface leakage and dielectric breakdown which might occur in a gap between the electrodes during driving.

Incidentally, the process of making the electrostatic actuator 3 according to the present illustrative embodiment is similar to the process of making the thin-film actuator 1, and therefore omitted for simplicity.

Fourth Illustrative Embodiment

Figure 4A:
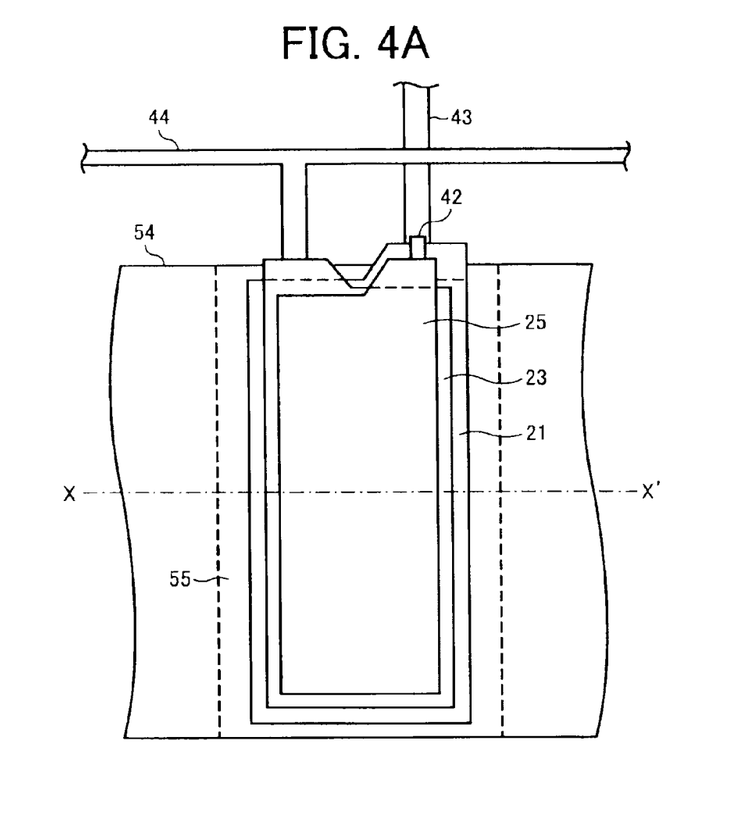
FIG. 4A is a plan view illustrating a thin-film actuator according to any of fourth to sixth illustrative embodiments.
Figure 4B:
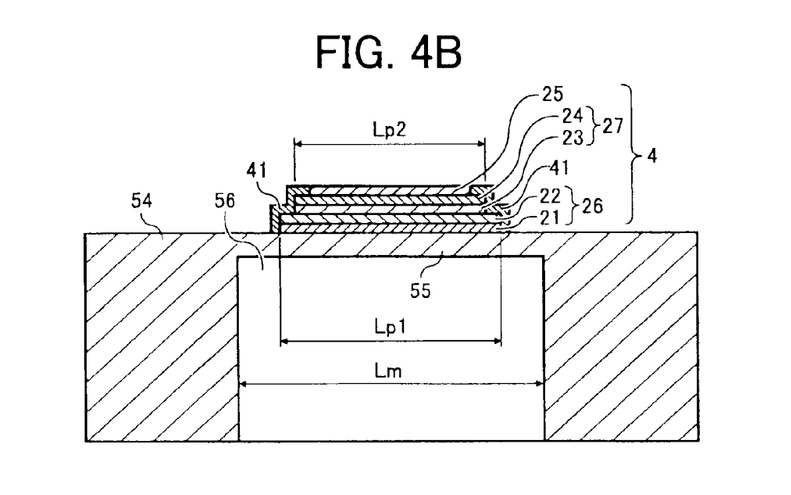
FIG. 4B is a cross-sectional view illustrating the thin-film actuator cut along a line X-X' illustrated in FIG. 4A.

A fourth illustrative embodiment is described with reference to FIGS. 4A and 4B. FIG. 4A is a plan view illustrating a thin-film actuator 4 according to any of fourth to sixth illustrative embodiments. FIG. 4B is a cross-sectional view illustrating the thin-film actuator 4 cut along a line X-X' illustrated in FIG. 4A.

In FIG. 4A, a first piezoelectric layer 22, a second piezoelectric layer 24, and a protective coating 41 illustrated in FIG. 4B are omitted from simplicity. The same reference numbers are allocated to the same components as those of the above-described illustrative embodiments and descriptions thereof are omitted for simplicity.

In the thin-film actuator 4 according to the fourth illustrative embodiment, as illustrated in FIG. 4B, element-end faces of the thin-film actuator 4, i.e., end faces of thin films constituting the thin-film actuator 4 are covered with the protective coating 41 made of an insulation material.

A conventional piezoelectric element may slowly change its properties by contacting components (e.g., moisture) in the atmosphere. Such a phenomenon may be facilitated by the application of voltage, and for example, when an electrode of Pt is used, hydrogen is generated by the catalytic effect of Pt, causing a change in properties of the piezoelectric material.

Hence, in the present illustrative embodiment, the end faces of the thin-film actuator 4 are covered with the protective coating 41 to prevent such a change in the piezoelectric material. As the material of the protective coating, for example, an Si oxidized film, an Si nitride film, or an oxidized Si nitride film may be used. Such a film may be formed by a sputtering method and patterned by a dry etching method. Incidentally, the process of making the thin-film actuator 4 according to the present illustrative embodiment (except for the protective coating 41 described above) is similar to the process of making the thin-film actuator 1, and therefore descriptions thereof are omitted for simplicity.

Fifth Illustrative Embodiment

A fifth illustrative embodiment is described below with reference to FIG. 4.

In the thin-film actuator 4 according to the present illustrative embodiment, a relation of Lm>Lp1>Lp2 is satisfied between the width "Lm" of the diaphragm 55, the width "Lp1" of the first deformation layer 26, and the width "Lp2" of the second deformation layer 27. Such a configuration can produce an increased deformation amount of the diaphragm 55.

For example, if the width Lm of the diaphragm 55 is smaller than the width Lp1 of the first deformation layer 26 and in other words the first deformation layer 26 is also deposited on a relatively thick portion of the silicon substrate 54 outside the diaphragm 55, the thick portion acts as a fixed end portion. Consequently, deformation of the first piezoelectric layer 22 may be constrained by the thick portion, preventing effective displacement of the diaphragm 55. Alternatively, if the width Lp2 of the second deformation layer 27 is longer than the width Lp1 of the first deformation layer 26, such a configuration may be difficult to achieve electric insulation and prevent deformation of the second deformation layer 27 and the first deformation layer 26, thus causing an operation failure of the thin-film actuator 4.

For the electrostatic actuator 3 (illustrated in FIG. 3) described above, each of the widths "Lp1" and "Lp2" of the deformation layers includes the thickness of a portion of the piezoelectric layer that covers the electrode layer.

Sixth Illustrative Embodiment

A sixth illustrative embodiment is described with reference to FIG. 4. For the operation of the thin-film actuator 4, the drive wiring and a method of supplying drive signals are described below. The following description is with respect to the thin-film actuator 4 according to the fourth illustrative embodiment. It is to be noted that the present illustrative embodiment can be applied to the thin-film actuator according to any of the first to fifth illustrative embodiments.

The thin-film actuator 4 according to the present illustrative embodiment includes at least three electrodes: the lower electrode 21, the intermediate electrode 23, and the upper electrode 25. Thus, it might be conceivable that three electric wires (lead wires) are required to connect the electrodes to driving circuits. For an inkjet head including a large number of rows of thin-film actuators, using a large number of lead wires increases the crossing points of wires. Consequently, even if an insulation layer is disposed between layers, such increased crossing points may cause an increased occurrence rate of short circuit, thus causing a reduction in yield. Further, using a large number of lead wires may result in a complex pattern or an increased wiring area. Consequently, the number of chips produced from a silicon wafer is reduced, causing an increased cost. In light of the above-described problem, the present illustrative embodiment is configured as follows.

As illustrated in FIG. 4A, the lower electrode 21 and the upper electrode 25 are electrically connected to an electrode connector 42 and led via the electrode connector 42 to a single wire, that is, a upper/lower electrode wire 43 for the upper and lower electrodes. Meanwhile, the intermediate electrode 23 is directly led to an intermediate electrode wire 44. Such a configuration allows reducing electrode wires and increasing yields and the number of chips produced from a wafer, thereby reducing cost.

Meanwhile, as for the method of supplying drive signals, the intermediate electrode 23 may be used as a common electrode with the lower electrode 21 and the upper electrode 25 as signal electrodes. By contrast, the intermediate electrode 23 may be used as a signal electrode with the lower electrode 21 and the upper electrode 25 as common electrodes.

Seventh Illustrative Embodiment

A seventh illustrative embodiment is described with reference to FIG. 5.

Figure 5:
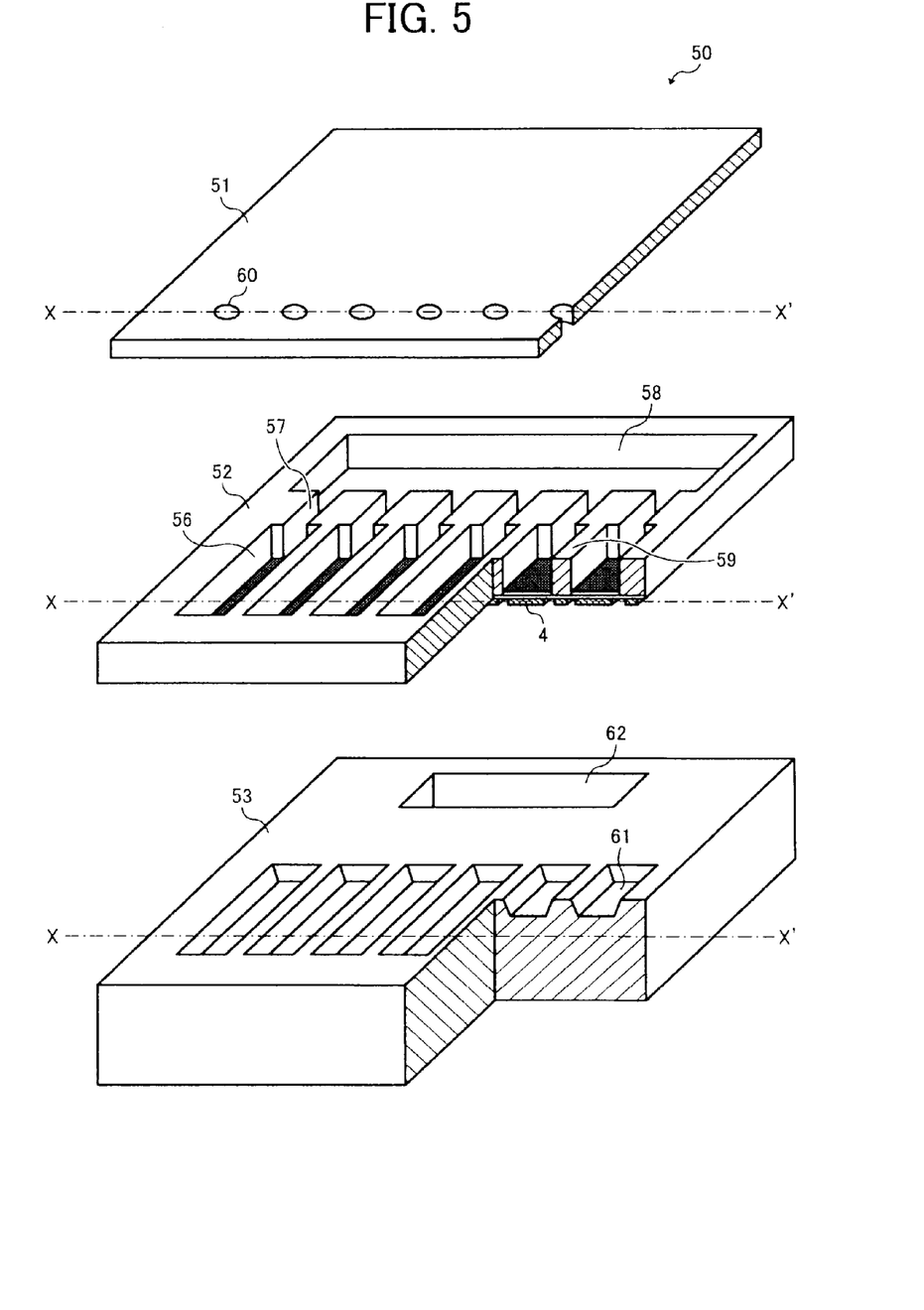
FIG. 5 is an exploded perspective view illustrating a configuration of an inkjet head according to a seventh illustrative embodiment.

FIG. 5 is an exploded perspective view illustrating a configuration of an inkjet head (liquid ejection head) 50 according to the present illustrative embodiment. FIG. 5 also partially shows a cross section of the inkjet head 50. In the present illustrative embodiment, a thin-film actuator according to any of the above-described illustrative embodiments may be mounted on the inkjet head 50. The following description is with respect to the thin-film actuator 4 according to the fourth illustrative embodiment. However, as described above, the present illustrative embodiment can be applied to the thin-film actuator according to any of the first to sixth illustrative embodiments. Below, a description is given of an example of a side-shooting method in which ink droplets are ejected from nozzle orifices formed at the surface of the nozzle substrate.

The inkjet head 50 has a multi-layer structure in which three substrates, i.e., a nozzle substrate 51, a chamber substrate 52, and a protective substrate 53 are superposed one on another. As illustrated in FIG. 5, nozzle orifices 60 are formed in the nozzle substrate 51, chambers, diaphragms, and piezoelectric elements are formed in the chamber substrate 52, and protective rooms 61 are formed in the protective substrate 53.

In the chamber substrate 52, the diaphragms 55 are formed as multi-layer films on a silicon substrate 54 (see FIG. 4). For example, the diaphragm 55 according to the present illustrative embodiment is formed from a silicon-on-insulator (SOI) substrate by depositing an Si oxidized film, an Si active layer, an Si oxidized film, and a Ti/Pt layer serving as a lower electrode of the piezoelectric element on one side of the silicon substrate 54. On the diaphragm 55, the thin-film actuator 4 is made by using the configuration and manufacturing process according to the above-described illustrative embodiments. Thus, the pressure chamber 56, the diaphragm 55, a fluid resistant portion (fluid supply channel) 57, and a common chamber 58 are formed in the chamber substrate 52.

The nozzle substrate 51 is a nickel substrate of a thickness of approximately 20 microns formed by high-speed nickel electroforming and has the nozzle orifices 60 communicating with the pressure chambers 56 at a surface of the chamber substrate 52.

A protective substrate 53 includes the protective room 61 to protect the piezoelectric element so as not to prevent displacement of the piezoelectric element.

Operations of the inkjet head 50 are described below.

As one preparation process, after the structure is formed, poling is performed on the piezoelectric materials. The upper electrode 25 and the intermediate electrode 23 are electrically shorted, and voltage is supplied between the upper electrode 25, the intermediate electrode 23, and the lower electrode 21 from approximately 10 minutes while gradually increasing the voltage from, e.g., 10V to 30V. Then, the upper electrode 25, the intermediate electrode 23, and the lower electrode 21 are electrically shorted, and voltage is supplied in the same manner. Thus, the polarization directions of the first piezoelectric layer 22 and the second piezoelectric layer 24 are aligned. Ink is filled to the inkjet head 50 prepared in the above-described manner. Ink is supplied from an ink supply port 62 to the pressure chambers 56 through the common chambers 58 and the fluid resistant portions 57. With the pressure chambers 56 filled with ink, a pulse potential of 20V is applied at the same time both between the lower electrode 21 and the intermediate electrode 23 and between the intermediate electrode 23 and the upper electrode 25. As a result, the first piezoelectric layer 22 and the second piezoelectric layer 24 deform (shrink) in a lateral vibration mode, and the diaphragm 55 closely attached to the piezoelectric element deforms in a convex shape toward the pressure chamber 56. Thus, the volume of the pressure chamber 56 decreases and the pressure in the pressure chamber 56 rapidly increases, thereby ejecting ink droplets from the nozzle orifices 60 to a recording sheet P. At this time, sequential application of pulse voltages allows sequential ejection of ink droplets.

As described above, the inkjet head according to the present illustrative embodiment is provided with the thin-film actuator according to any of the above-described illustrative embodiments, thus achieving a high-density and compact inkjet head operable with a relatively low driving voltage.

Eighth Illustrative Embodiment

Figure 6:
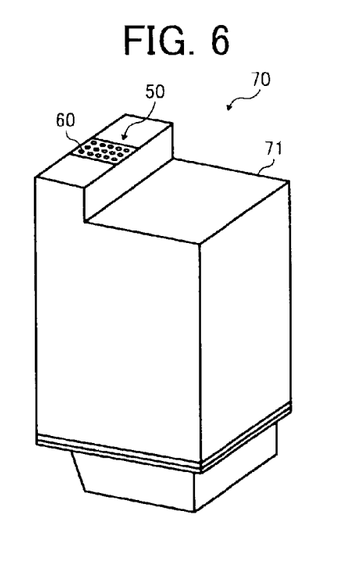
FIG. 6 is a perspective view illustrating a configuration of an ink cartridge according to an illustrative embodiment.

Next, an ink cartridge 70 according to an illustrative embodiment is described with reference to FIG. 6.

The ink cartridge 70 includes the inkjet head 50 according to the above-described illustrative embodiment and an ink tank 71 that supplies ink to the inkjet head 50. The inkjet head 50 includes the nozzle orifices 60 and is integrated with the ink tank 71 as the ink cartridge 70.

Such an integrated configuration, cost reduction and reliability enhancement of the inkjet head directly leads to cost reduction and reliability enhancement of the entire ink cartridge, thus improving the yield and reliability of the ink cartridge.

Ninth Illustrative Embodiment

Figure 7:
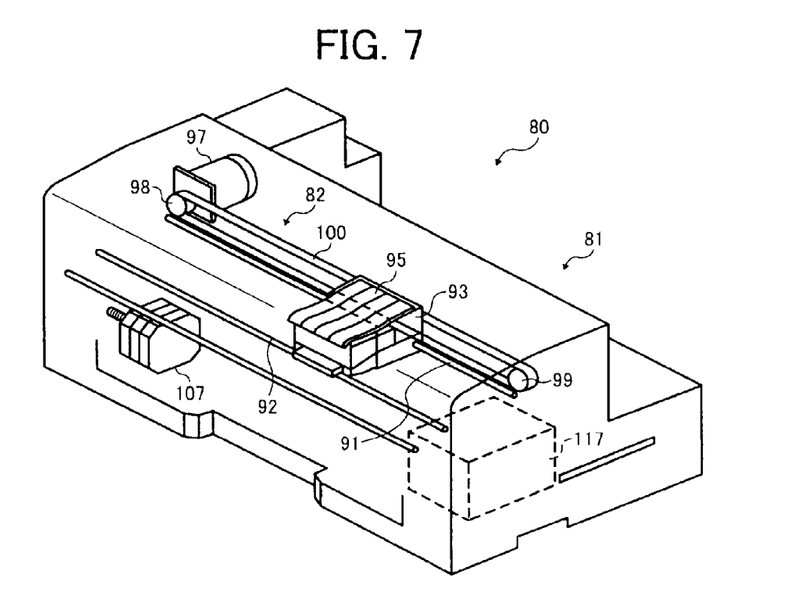
FIG. 7 is a partially-transparent perspective view illustrating an inkjet recording apparatus according to an illustrative embodiment.
Figure 8:
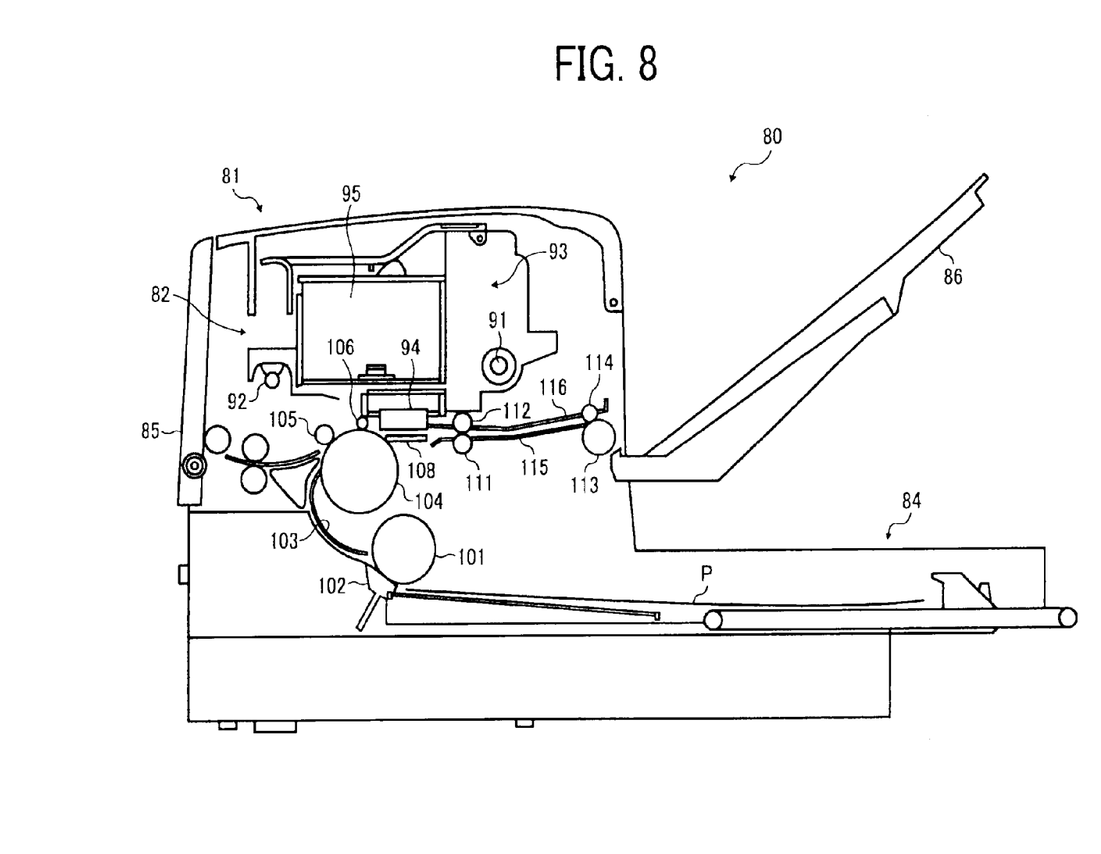
FIG. 8 is a schematic view illustrating an internal structure of the inkjet recording apparatus illustrated in FIG. 7.

Next, an example of an inkjet recording apparatus including the inkjet head according to the above-described illustrative embodiment is described with reference to FIGS. 7 and 8. FIG. 7 is a partially-transparent perspective view illustrating an inkjet recording apparatus 80 according to an illustrative embodiment. FIG. 8 is a schematic view illustrating an internal structure of the inkjet recording apparatus 80.

The inkjet recording apparatus 80 has a print section 82 in an apparatus housing 81. The print section 82 includes a carriage 93 movable in a main scan direction, recording heads 94 formed with inkjet heads 50 according to the above-described illustrative embodiment, and ink cartridges 95 that supply ink to the recording heads 94. At a front lower portion of the apparatus housing 81, a sheet feed cassette capable is removably mounted to store a number of sheets P. Further, a manual feed tray 85 with which a user manually feeds sheets is pivotably mounted at the front side of the apparatus housing 81. Receiving a sheet from the sheet feed cassette 84 or the manual feed tray 85, the print section 82 records (forms) an image on the sheet and outputs the sheet to an output tray 86 mounted at the rear side of the apparatus housing 81.

In the print section 82, the carriage 93 is supported by a main guide rod 91 and a sub guide rod 92 serving as guide members so as to slide in the main scan direction. The main guide rod 91 and the sub guide rod 92 are laterally extended between side plates. On the carriage 93 are mounted the recording heads 94 formed with the inkjet heads 50 according to any of the above-described illustrative embodiments to eject ink droplets of different colors, e.g., yellow (Y), cyan (C), magenta (M), and black (K). In the recording heads 94, a plurality of nozzle orifices is arranged in a direction perpendicular to the main scan direction so as to eject ink droplets downward. The ink cartridges 95 that supply different color inks to the recording heads 94 are replaceably mounted on the carriage 93.

Each of the ink cartridges 95 has an air release port opened to the atmosphere at an upper portion thereof, a supply port through which ink is supplied to the inkjet head 50 at a lower portion thereof, and a porous member therein to be filled with ink. Ink supplied to the ink cartridge 95 is kept at a slight negative pressure by a capillary force of the porous member. In the present illustrative embodiment, the recording heads 94 are described as a plurality of recording heads for ejecting different color inks. However, it is to be noted that one recording head may be used to eject droplets of different color inks through separate rows of the nozzle orifices 60.

The main guide rod 91 is inserted through a rear portion (at the downstream side in the sheet conveyance direction) of the carriage 93 so that the carriage 93 slides on the main guide rod 91. Meanwhile, a front portion (at the upstream side in the sheet conveyance direction) of the carriage 93 is slidably mounted on the sub guide rod 92. To move the carriage 93 for scanning in the main scan direction, a timing belt 100 is extended with tension between a driving pulley 98, which is driven by a main scan motor 97, and a driven pulley 99. The carriage 93 is fixed on the timing belt and is reciprocally moved via the timing belt by forward and reverse rotation of the main scan motor 97.

To feed sheets P from the sheet feed cassette 84 below the recording head 94, the inkjet recording apparatus 80 includes a sheet feed roller 101 and a friction pad 102 to feed the sheets P sheet by sheet from the sheet feed cassette 84, a guide member 103 to guide the sheet P, a conveyance roller 104 to convey the sheet P while turning around the conveyance direction of the sheet P, a press roller 105 pressed against the surface of the conveyance roller 104, and a front-end regulation roller 106 to regulate an angle at which the sheet P is fed from the conveyance roller 104. The conveyance roller 104 is driven by a sub-scan motor 107 via gears.

The inkjet recording apparatus 80 also includes a print receiver 108 serving as a sheet guide member that guides the sheet P from the conveyance roller 104 below the recording head 94 within a moving range of the carriage 93 in the main scan direction. At the downstream side of the print receiver 108 in the sheet conveyance direction are disposed a transport roller 111 and a spur 112 that are rotated to feed the sheet P in the sheet output direction, a sheet output roller 113 and a spur 114 that feed the sheet P to the output tray 86, and guide members 115 and 116 forming a sheet output passage.

During image recording, the inkjet recording apparatus 80 drives the recording head 94 in accordance with image signals while moving the carriage 93 to eject ink droplets onto the sheet P stopped below the recording head 94. Thus, one band of the desired image is recorded on the sheet P, and after the sheet P is fed by a predetermined distance, another band of the image is recorded. Receiving a recording end signal or a signal indicating that the rear end of the sheet P has arrived at the recording area of the recording heads 94, the recording operation is finished and the sheet P is outputted to the output tray 86.

At a position outside the recording area at one end in the moving direction of the carriage 93 is disposed a recovery device 117 that eliminates an ejection failure of the recording head 94. The recovery device 117 includes a cap unit, a suction unit, and a cleaner. In a standby mode, the carriage 93 is positioned above the recovery device 117, and the recording head 94 is capped with the cap unit to keep the moisture of ejection nozzles, thus preventing an ejection failure caused by ink drying. By discharging ink for maintenance during recording, the viscosity of ink in ejection nozzles is kept substantially constant, allowing a stable ejection performance.

If an ejection failure occurs, the cap unit seals the nozzle orifices 60 of the recording head 94 and the suction unit suctions air bubbles as well as ink from the ejection nozzles. Then, the cleaner removes ink or dust adhered at the ejection face of the recording head 94, thus eliminating the ejection failure. The suctioned ink is drained to a waste ink container disposed at a lower portion of the inkjet recording apparatus 80 and absorbed in an ink absorber in the waste ink container.

As described above, the inkjet recording apparatus may include the inkjet head having the actuator according to any of the above-described illustrative embodiments. Such a configuration can prevent an ejection failure of ink droplets caused by a failure in driving the diaphragm, obtain stable ejection properties, and improve image quality.

Further, as described above, the reduced size of the thin-film actuator according to any of the above-described illustrative embodiments can achieve high density, low driving voltage, and downsizing of the piezoelectric element. Such a configuration can obtain an increased generation force to achieve high density or eject high-viscosity liquid, e.g., high-viscosity ink such as UV ink, highly-concentrated pigment ink, ink containing materials for thin-film formation, liquid resist, or biological fluid such as DNA sample.

The above-described illustrative embodiments are applicable to not only the above-described liquid-droplet ejection head (e.g., inkjet head) but, e.g., different types of optical scan mirrors (projectors, head mount displays, optical writing elements such as polygon-mirror systems, and optical communication switches in the field of optics, micro pumps in the field of fluid transportation, and biochips in the field of biotechnology.

Numerous additional modifications and variations are possible in light of the above teachings. It is therefore to be understood that within the scope of the appended claims, the disclosure of the present invention may be practiced otherwise than as specifically described herein.

With some embodiments of the present invention having thus been described, it will be obvious that the same may be varied in many ways. Such variations are not to be regarded as a departure from the scope of the present invention, and all such modifications are intended to be included within the scope of the present invention.

For example, elements and/or features of different illustrative embodiments may be combined with each other and/or substituted for each other within the scope of this disclosure and appended claims.

What is claimed is:

1. A thin-film actuator that deforms a diaphragm to generate force, the actuator comprising:
   a lower electrode disposed on the diaphragm;
   a first piezoelectric layer disposed on the lower electrode;
   an intermediate electrode disposed on the first piezoelectric layer;
   a second piezoelectric layer disposed on the intermediate electrode, the second piezoelectric layer and the intermediate electrode having a same width; and
   an upper electrode disposed on the second piezoelectric layer, wherein
   peripheral edges of the intermediate electrode on the first piezoelectric layer are spaced at a distance from peripheral edges of the first piezoelectric layer to create a step between the peripheral edges of the first piezoelectric layer and the peripheral edges of the intermediate electrode.

2. The thin-film actuator according to claim 1, wherein peripheral edges of the intermediate electrode are closer to the center of the actuator than peripheral edges of the first piezoelectric layer and peripheral edges of the upper electrode are closer to the center of the actuator than peripheral edges of the second piezoelectric layer.

3. The thin-film actuator according to claim 1, wherein the lower electrode is covered by the first piezoelectric layer.

4. The thin-film actuator according to claim 1, further comprising a protective coating that covers end faces of the lower electrode, the first piezoelectric layer, the intermediate electrode, the second piezoelectric layer, and the upper electrode.

5. The thin-film actuator according to claim 1, wherein Lm>Lp1>Lp2,
where Lm represents a width of the diaphragm,
Lp1 represents a width of a first deformation layer including the lower electrode and the first piezoelectric layer, and
Lp2 represents a width of a second deformation layer including the intermediate electrode and the second piezoelectric layer.

6. The thin-film actuator according to claim 1, wherein the upper electrode is electrically connected to the lower electrode and the intermediate electrode is used as a common electrode while the lower electrode and the upper electrode are used as signal electrodes.

7. The thin-film actuator according to claim 1, wherein the upper electrode is electrically connected to the lower electrode and the intermediate electrode is used as a signal electrode while the lower electrode and the upper electrode are used as common electrodes.

8. A liquid-droplet ejection head, comprising:
a nozzle orifice through which a liquid droplet is ejected;
a pressure chamber connected to the nozzle orifice; a diaphragm that forms a wall of the pressure chamber; and
a thin-film actuator that deforms the diaphragm to eject the liquid droplet from the nozzle orifice,
the thin-film actuator including
a lower electrode disposed on the diaphragm,
a first piezoelectric layer disposed on the lower electrode,
an intermediate electrode disposed on the first piezoelectric layer,
a second piezoelectric layer disposed on the intermediate electrode, the second piezoelectric layer and the intermediate electrode having a same width, and
an upper electrode disposed on the second piezoelectric layer, wherein
peripheral edges of the intermediate electrode on the first piezoelectric layer are spaced at a distance from peripheral edges of the first piezoelectric layer to create a step between the peripheral edges of the first piezoelectric layer and the peripheral edges of the intermediate electrode.

9. An ink cartridge, comprising:
the liquid-droplet ejection head according to claim 8; and
an ink container integrated with the liquid-droplet ejection head, the ink container storing ink to be supplied to the liquid-droplet ejection head.

10. An image forming apparatus comprising:
an ink cartridge, the ink cartridge including
an ink container that stores ink, and
a liquid-droplet ejection head integrated with the ink container,
the liquid-droplet ejection head including
a nozzle orifice through which a liquid droplet is ejected,
a pressure chamber connected to the nozzle orifice,
a diaphragm that forms a wall of the pressure chamber, and
a thin-film actuator that deforms the diaphragm to eject the liquid droplet from the nozzle orifice,
the thin-film actuator including
a lower electrode disposed on the diaphragm,
a first piezoelectric layer disposed on the lower electrode,
an intermediate electrode disposed on the first piezoelectric layer,
a second piezoelectric layer disposed on the intermediate electrode, the second piezoelectric layer and the intermediate electrode having a same width; and, and
an upper electrode disposed on the second piezoelectric layer, wherein
peripheral edges of the intermediate electrode on the first piezoelectric layer are spaced at a distance from peripheral edges of the first piezoelectric layer to create a step between the peripheral edges of the first piezoelectric layer and the peripheral edges of the intermediate electrode.

* * * * *